United States Patent [19]

Fujitsu

[11] Patent Number: 5,767,572
[45] Date of Patent: *Jun. 16, 1998

[54] SEMICONDUCTOR INTEGRATED CIRCUIT DEVICE ASSEMBLY

[75] Inventor: Takao Fujitsu, Kanagawa-ken, Japan

[73] Assignee: Kabushiki Kaisha Toshiba, Kawasaki, Japan

[*] Notice: The term of this patent shall not extend beyond the expiration date of Pat. No. 5,448,106.

[21] Appl. No.: 810,219

[22] Filed: Feb. 28, 1997

Related U.S. Application Data

[60] Continuation of Ser. No. 453,507, May 30, 1995, Pat. No. 5,672,908, which is a division of Ser. No. 373,491, Jan. 17, 1995, Pat. No. 5,448,106, which is a continuation of Ser. No. 185,215, Jan. 24, 1994, abandoned, which is a continuation of Ser. No. 931,326, Aug. 18, 1992, abandoned.

[30] Foreign Application Priority Data

Aug. 20, 1991 [JP] Japan ................. 3-207087

[51] Int. Cl.⁶ ........................ H01L 23/31; H01L 23/48
[52] U.S. Cl. .................... 257/668; 257/691; 257/692; 257/790
[58] Field of Search ................. 257/666, 668, 257/676, 690, 692, 723, 724, 787, 790, 792, 793, 691, 698, 701, 702; 361/398

[56] References Cited

U.S. PATENT DOCUMENTS

| | | | |
|---|---|---|---|
| 5,130,783 | 7/1992 | McLellan | 357/74 |
| 5,160,999 | 11/1992 | Opitz | 257/702 |
| 5,448,106 | 9/1995 | Fujitsu | 257/668 |
| 5,672,908 | 9/1997 | Fujitsu | 257/668 |

FOREIGN PATENT DOCUMENTS

| | | | |
|---|---|---|---|
| 0122687 | 10/1984 | European Pat. Off. . | |
| 0054252 | 3/1984 | Japan | 257/666 |
| 0049456 | 2/1990 | Japan | 257/676 |
| 0171655 | 7/1991 | Japan | 257/666 |
| 0174092 | 12/1991 | Taiwan . | |
| 2042802 | 9/1980 | United Kingdom . | |

*Primary Examiner*—Peter Toby Brown
*Attorney, Agent, or Firm*—Finnegan, Henderson, Farabow, Garrett & Dunner, L.L.P.

[57] ABSTRACT

A plurality of electrodes are formed on one surface of a semiconductor integrated circuit chip. A plurality of leads are arranged around the chip. Each of the electrodes and one end of each of the leads are connected. The electrodes and the chip are sandwiched between two films. One of the films is in direct contact with the one surface of the chip. The other film is in direct contact with the other surface of the chip.

3 Claims, 4 Drawing Sheets

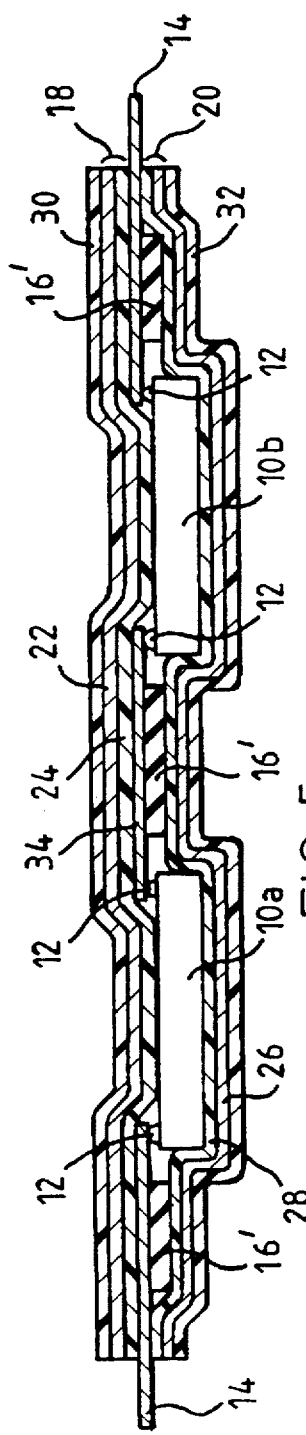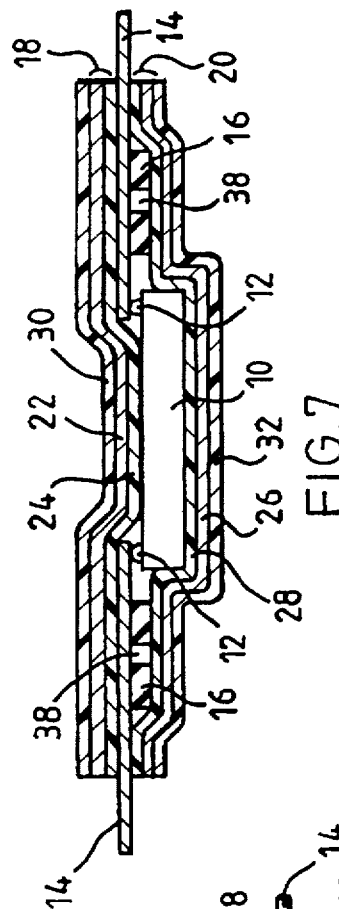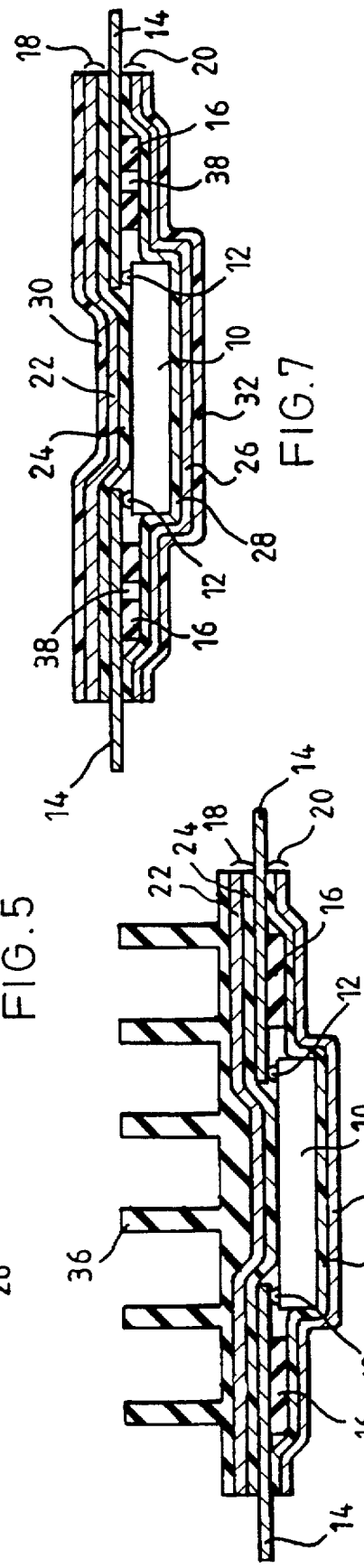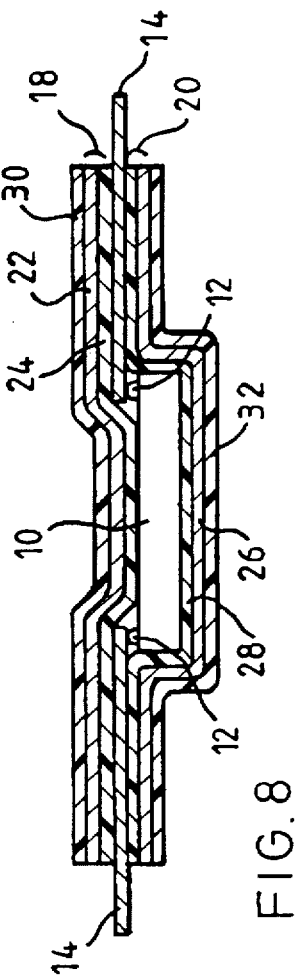

SEMICONDUCTOR INTEGRATED CIRCUIT DEVICE ASSEMBLY

This is a continuation of application Ser. No. 08/453,507, filed May 30, 1995, now U.S. Pat. No. 5,672,908, which is a divisional of application Ser. No. 08/373,491 filed Jan. 17, 1995, now U.S. Pat. No. 5,448,106, which is a continuation of application Ser. No. 08/185,215 filed Jan. 24, 1994, now abandoned, which is a continuation of application Ser. No. 07/931,326 filed Aug. 18, 1992, now abandoned.

BACKGROUND OF THE INVENTION

1. Field of the Invention

This invention relates to a semiconductor device assembly and more specifically to a thin type semiconductor integrated circuit device assembly.

2. Description of the Prior Art

Recently, the demand for thin type semiconductor integrated circuit chip assembly has increased because thin type electronic equipment, such as IC cards, have become more widely used.

The use of potting resin sealed plastic packages is well known as an assembly technique for such chips. In this type assembly, liquid plastic resin is deposited at the periphery of a chip. The electrodes of the chip are connected to a plurality of leads formed and arranged on a tape. The liquid plastic resin fixes the connection between the leads and the electrodes and protects the assembly from mechanical stress and various environmental conditions.

With this technique, since the resin is deposited, it is difficult to control the thickness of the assembly. Moreover, a thin film coating of less than 1 mm for large sized chips requires resin viscosity adjustment and thus, there are limits to the resins which can be used. Resins which prevent moisture penetration generally cannot be used to prepare thin film coatings of less than 1 mm.

Ceramic packages and molded resin sealed plastic packages have also been used for the assembly of semiconductor integrated circuit chips. However, such packages usually cannot absorb external forces and are more likely to be damaged, since they are hard type packages and are fragile when subjected to even slight deformations. For this reason, it is difficult to produce and use assemblies of less than 1 mm thickness for large sized chips.

SUMMARY OF THE INVENTION

Therefore, an object of the present invention is to provide a semiconductor device assembly which can be made thinner while maintaining its beneficial characteristics.

To achieve the object, this invention provides a semiconductor device assembly comprising: a semiconductor chip having first and second surfaces; a plurality of electrodes on the first surface; a plurality of leads arranged around the chip, each of the leads having an end portion which contacts one of the electrodes; and first and second films, the first film directly contacting the first surface and the second film directly contacting the second surface, the first and second films being on opposite sides of the semiconductor chip and the leads.

Furthermore, this invention provides a semiconductor device assembly comprising: a first semiconductor chip having first and second surfaces; a second semiconductor chip having third and fourth surfaces; first and second electrodes on the first surface; a third and a fourth electrodes on the third surface; a first lead having a first end portion which contacts the first electrode; a second lead having a second end portion which contacts the fourth electrode; a third lead having a third end portion which contacts the second electrode, and a fourth end portion which contacts the third electrode; and first and second films, the first film directly contacting the first and the third surfaces, and the second film directly contacting the second and the fourth surfaces, the first and second films being on opposite sides of the first and second semiconductor chips and the first, the second and the third leads.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings:

FIGS. 3 to 9 are sectional views of second, third, fourth, fifth, sixth, seventh and eighth embodiments of a semiconductor device assembly according to the present invention, respectively.

DETAILED DESCRIPTION OF THE INVENTION

Figure 1:
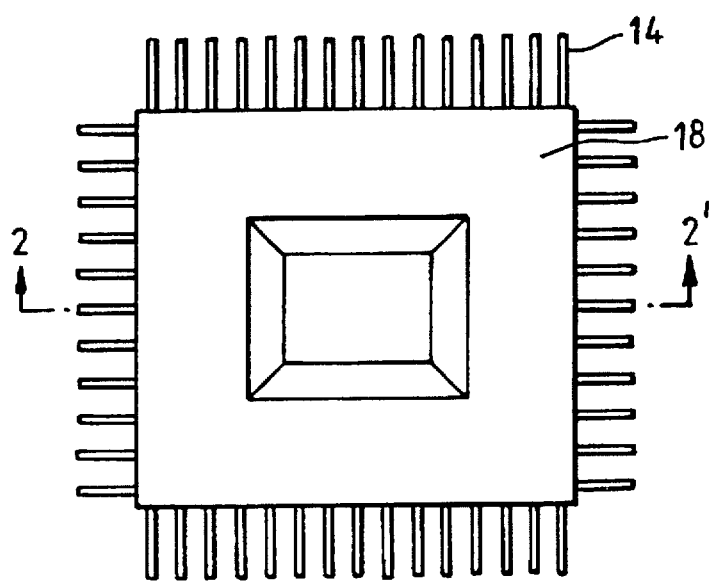
FIG. 1 is a plan view of a first embodiment of a semiconductor device assembly according to the present invention.

Referring now to the drawings, the present invention will be explained.

First Embodiment

Figure 2:
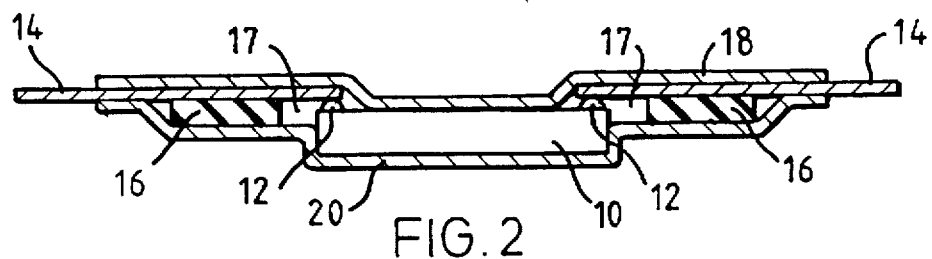
FIG. 2 is a cross-sectional view taken along the line 2—2' in FIG. 1.

A first embodiment of a semiconductor device assembly according to the present invention will be described with reference to FIGS. 1 and 2. FIG. 1 is a plan view of a first embodiment of a semiconductor device assembly according to the present invention. FIG. 2 is a cross-sectional view taken along the line 2—2' in FIG. 1.

In the assembly, a plurality of electrodes 12 for supplying power voltages and input signals to a semiconductor integrated circuit chip 10, and for bringing out output signals from the chip 10 are formed on the main surface of the chip 10. The electrodes are formed by conventional bump technology or pad technology. The main surface of the chip 10 except for the regions of the electrodes 12 is covered with an insulating passivation film (not shown). The electrodes 12 are contacted with inner end portions of a plurality of leads 14 using a micro-bonding technology such as a conventional TAB (Tape Automated Bonding) technology or MPB (Micro Plating Bonding) techonology described and claimed in commonly assigned U.S. continuation patent application Ser. No. 08/344,605. These leads are formed and arranged on a rectangular shaped tape 16 having a rectangular hole 17 in the center thereof. The inner portions of the leads 14 extend from the tape 16 toward the chip 10. Outer portions of the leads 14 also extend apart from the chip 10.

Except for the outer end portions of the leads 14, the chip 10, the leads 14 and the tape 16 are sandwiched between a front film 18 and a back film 20. This sandwiching process is done under a vacuum or reduced pressure. These films 18 and 20 are thermally fused with the tape 16 and adhered to each other. The films 18 and 20 are made of insulating, flexible, dampproof and thermally conductive material such as polyimide resin. Also, a technique using an adhesive for sandwiching the chip 10, the leads 14 and the tape 16 may be used instead of above-described thermal fusing technique.

Here, the front film 18 is made in close contact with the main surface of the chip 10 and with the leads 14. The back film 20 is also made in close contact with the back surface of the chip 10, with a part of a side surface of the chip 10, with the tape 16 and with the leads 14. The chip 10 is hermetically sealed in a vacuum or reduced pressure. Thus, no space is wasted and a very thin semiconductor device assembly can be obtained.

In this embodiment, the thickness of the chip 10 is 0.25 mm, the height of the electrodes 12 is 0.07 mm, the thickness of the leads 14 is 0.03 mm, the thickness of the tape 16 is 0.07 mm and the thicknesses of the front film 18 and the back film 20 are 0.025 mm, respectively. In this case, the assembly with a thickness of approximately 0.4 mm can be obtained.

Also, in this embodiment, because the main and the back surfaces directly contact the front film 18 and the back film 20, thermal dispersion within the assembly is significantly improved.

Additionally, resistance of the assembly to dampness can be improved by making the films 18 and 20 wider and thus making the moisture penetration paths from the bonded portions of the films 18 and 20 longer.

Second Embodiment

Figure 3:
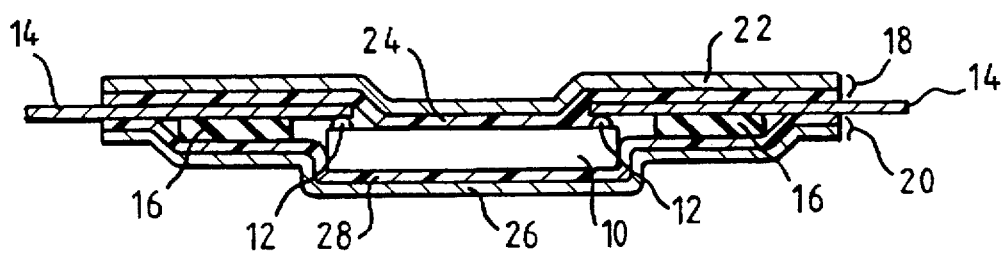

FIG. 3 is a cross-sectional view of a second embodiment according to the present invention.

In this embodiment, the front film 18 is constructed of two layers, namely, an inorganic layer 22 of thickness 0.015 mm and an adhesive layer 24 of thickness 0.025 mm. The back film 20 is also constructed of two layers, namely, an inorganic layer 26 of thickness 0.015 mm and an adhesive layer 28 of thickness 0.025 mm. The adhesive layers are made of epoxy resin and the inorganic layers are made of metal such as aluminium, copper, iron or a mixture of these metals.

The adhesive layers 24 and 28 adhere the inorganic layers 22 and 26 to the chip 10, the leads 14 and the tape 16, and also adhere, in part, to each other.

Because inorganic matter, especially metal, has excellent dampproof characteristics and thermal conductivity, resistance of the assembly to dampness, and heat dissipation of the assembly can be improved with this embodiment.

Additionally, when metal is used as the inorganic layers 22 and 26, it may be possible to use the inorganic layers 22 and 26 as a shield plate and to dampen noise. Furthermore, when the assembly is mounted on a printed circuit board using an adhesive, heat from the assembly can be more easily radiated to the printed circuit board via the inorganic layer 26 and the adhesive.

Third Embodiment

Figure 4:
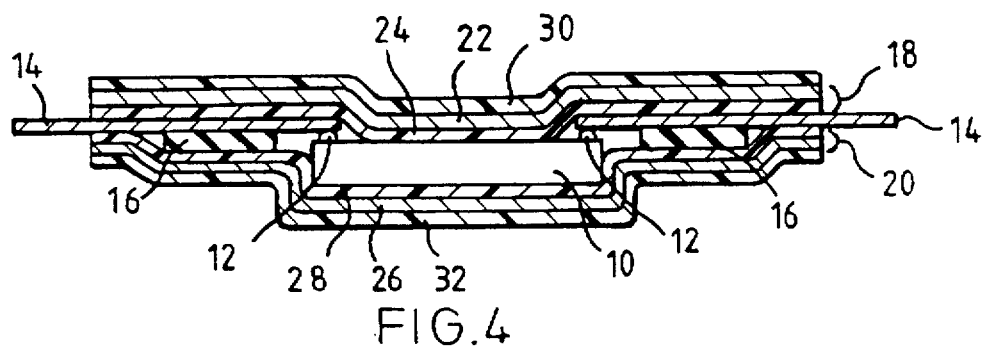

FIG. 4 is a cross-sectional view of a third embodiment according to the present invention.

In this embodiment, the inorganic layers 22 and 26 are covered with protection layers 30 and 32. Each of the protection layers 30 and 32 is made of epoxy resin and has a thickness of about 0.01 mm.

In this embodiment, it is possible to protect the inorganic layers 22 and 26 from deterioration, such as oxidation.

Fourth Embodiment

FIG. 5 is a cross-sectional view of a fourth embodiment according to the present invention.

In this embodiment, two chips 10a and 10b are assembled. Numeral 16' designates a tape which has two rectangular openings corresponding the chips 10a and 10b. Internal leads 34 are formed and arranged on the tape 16' for the purpose of connecting the electrodes 12 of the chips. In this embodiment, it is possible to assemble a plurality of chips with a smaller overall assembly.

Fifth Embodiment

FIG. 6 is a cross-sectional view of a fifth embodiment according to the present invention.

In this embodiment, a plurality of cooling fins 36 are adhered on the front film 18 with an appropriate adhesive. Thus, heat from the chip 10 can be more easily dissipated to the exterior.

Sixth Embodiment

FIG. 7 is a cross-sectional view of a sixth embodiment according to the present invention.

In this embodiment, one or more slits 38 are formed in the tape 16. These slits 38 can absorb stress on the assembly. Therefore, the assembly can flexibly withstand distortion due to an external force.

Also, it may be possible to substitute one or more grooves for the slits 38.

Seventh Embodiment

FIG. 8 is a cross-sectional view of a seventh embodiment according to the present invention.

In this embodiment, the tape 16 of the assembly shown in FIG. 4 or FIG. 7 is not used. In this embodiment, the outer portions of the leads 14 are connected to each other by an adhesive tape (not shown) before the sandwiching process for the purpose of arranging the leads 14. After the sandwiching process, the adhesive tape is removed. In this embodiment, it is desirable that the leads 14 be made thicker, e.g. 0.08 mm, to maintain the strength of the leads 14.

Eighth Embodiment

Figure 9:
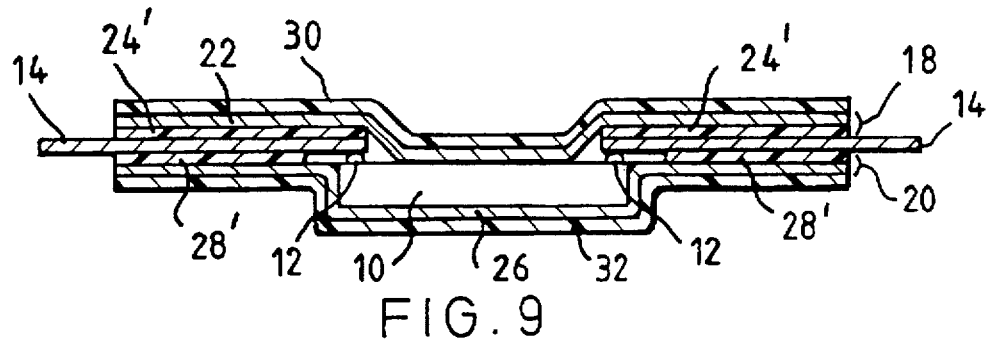

FIG. 9 is a cross-sectional view of an eighth embodiment according to the present invention.

In this embodiment, the center portions of adhesive layers 24' and 28' which correspond to the main surface and the back surface of the chip 10 are removed, and the center portions of the inorganic layers 22 and 26 are in direct contact with the main surface and the back surface of the chip 10. In this embodiment, heat from the chip 10 can be more easily radiated to the exterior due to the lack of the adhesive layer in contact with the chip 10.

Ninth Embodiment

Figure 10:
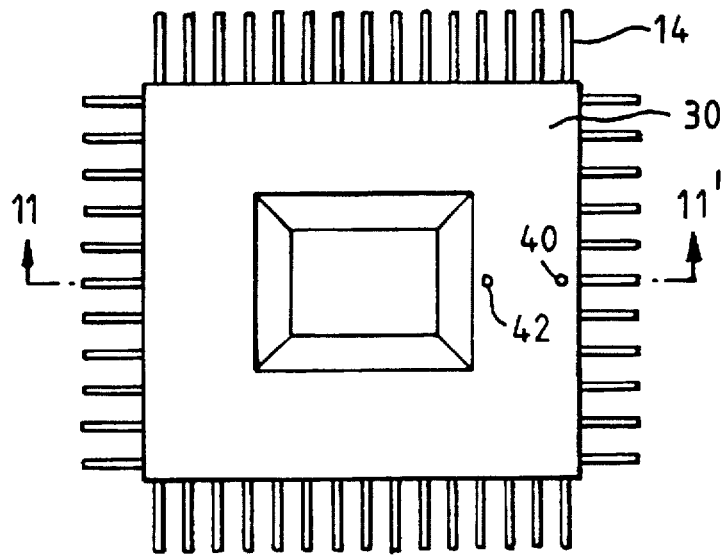
FIG. 10 is a plan view of a ninth embodiment of a semiconductor device assembly according to the present invention.
Figure 11:
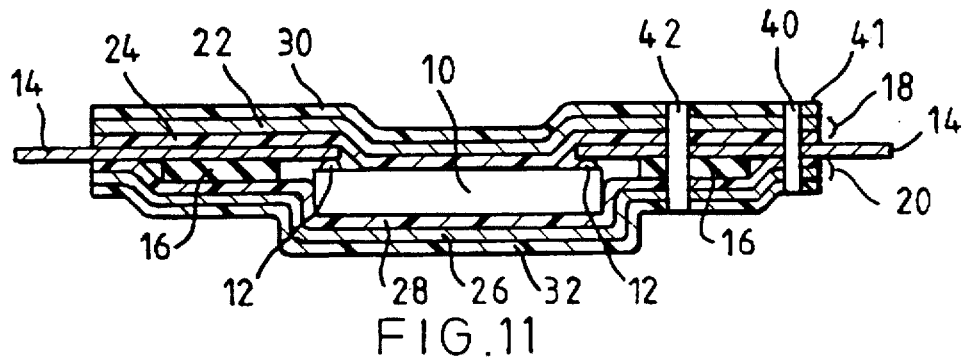
FIG. 11 is a cross-sectional view taken along the line 11—11' FIG. 10.

FIG. 10 is a plan view of a ninth embodiment according to the present invention. FIG. 11 is a cross-sectional view taken along the line 11—11' in FIG. 10.

In this embodiment, a hole 40 penetrates through one of the leads 14 which corresponds to ground level voltage. The hole 40 also passes through the front film 18, the back film 20 and the protection layers 30 and 32 at an edge portion 41 of the assembly. A hole 42 penetrates through the ground level lead, the front film 18, the back film 20, the protection layers 30 and 32 and the tape 16 nearer to the chip 10 than the hole 40. The holes 40 and 42 are filled with a conductive material, such as conductive paste. Metal may be used as the inorganic layers 22 and 26.

Thus, the electric potential of the inorganic layers 22 and 26 is maintained at ground level and the inorganic layers 22 and 26 act as branch lines of the lead when the assembly is in operation. Accordingly, in this embodiment, the impedance of the ground level lead is decreased and the fluctuation of the potential at the electrode of the chip 10 which connects the lead is suppressed even if the assembly operates at a higher frequency. Thus, operation of the chip 10 at a higher frequency is made possible.

Additionally, in this embodiment, an improved shielding effect is obtainable.

Also, it is possible to coat metal onto the surface wall of the holes 40 and 42 instead of filling the holes 40 and 42 with conductive material.

Tenth Embodiment

Figure 12:
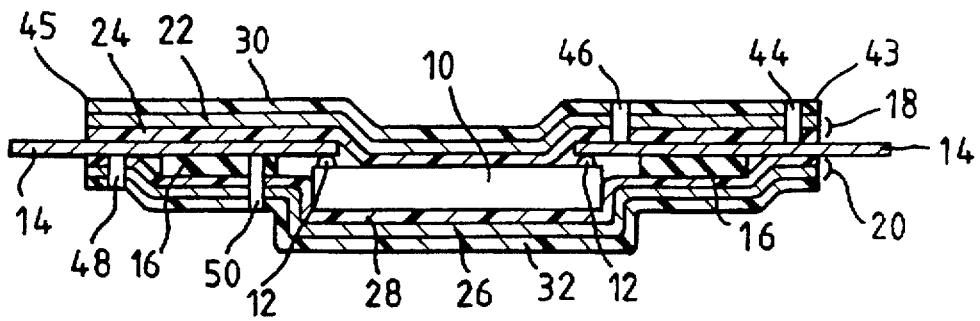
FIGS. 12 and 13 are cross-sectional views of tenth and eleventh emdiments of a semiconductor device assembly according to the present invention, respectively.

FIG. 12 is a cross-sectional view of a tenth embodiment according to the present invention.

In this embodiment, a hole 44 penetrating the front film 18 and the protection layer 30 is opened at an edge portion 43 of the assembly. A hole 46 penetrating the front film 18 and the protection layer 30 is also opened nearer to the chip 10. These holes 44 and 46 are opened on one of the leads 14 which corresponds to the ground level voltage and are filled with conductive material. Thus, the inorganic layer 22 of the front film 18 can be used as a branch line of the ground level lead when the assembly is in operation, and as a shielding plate of the ground level voltage.

Additionally in this embodiment, a hole 48 penetrating the back film 20 and the protection layer 32 is opened at an edge portion 45 of the assembly. A hole 50 penetrating the tape 16, the back film 20 and the protection layer 32 is also opened nearer to the chip 10. These holes 48 and 50 are opened on another one of the leads 14 which corresponds to the power supply voltage and are filled with conductive material. Thus, the inorganic layer 26 of the back film 20 can be used as a branch line of the power supply voltage level lead when the assembly is in operation, and as a shielding plate of the power supply voltage.

Eleventh Embodiment

Figure 13:
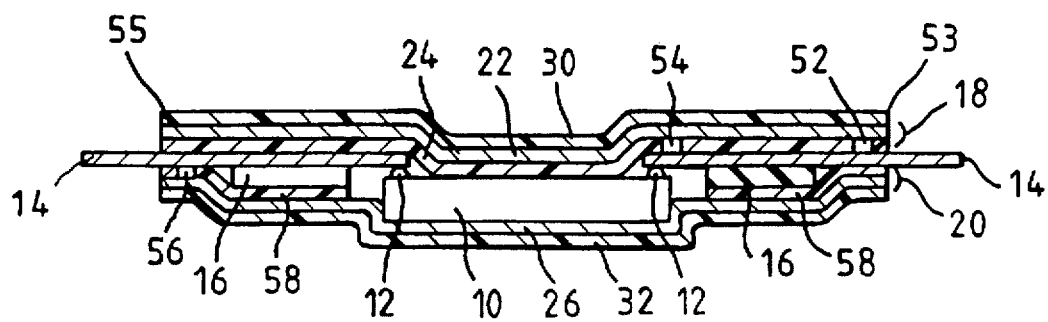

FIG. 13 is a cross-sectional view of an eleventh embodiment according to the present invention.

In this embodiment, a hole 52 penetrating the adhesive layer 24 of the front film 18 is opened at an edge portion 53 of the assembly. A hole 54 penetrating the adhesive layer 24 of the front film 18 is opened nearer to the chip 10. These holes 52 and 54 are opened on one of the leads 14 which corresponds to the ground level voltage and filled with conductive material. Thus, the inorganic layer 22 of the front film 18 can be used as a branch line of the ground level lead when the assembly is in operation, and as a shilding plate of the ground level voltage.

Also, the center portion of adhesive layer 58 which corresponds the back surface of the chip 10 is removed, and the center portion of the inorganic layer 26 is in direct contact with the the back surface of the chip 10. A hole 56 penetrating the adhesive layer 24 of the back film 20 is opened at an edge portion 55 of the assembly. The hole 56 is opened on another one of the leads 14 which corresponds to the power supply voltage and is filled with conductive material.

When the back surface of the chip 10 is electrically connected, in the chip 10, to the one of the electrodes 12 which contacts the other lead, the inorganic layer 26 of the back film 20 can be used as a branch line of the power supply voltage level lead when the assembly is in operation, and as a shielding plate of the power supply voltage.

Figure 14:
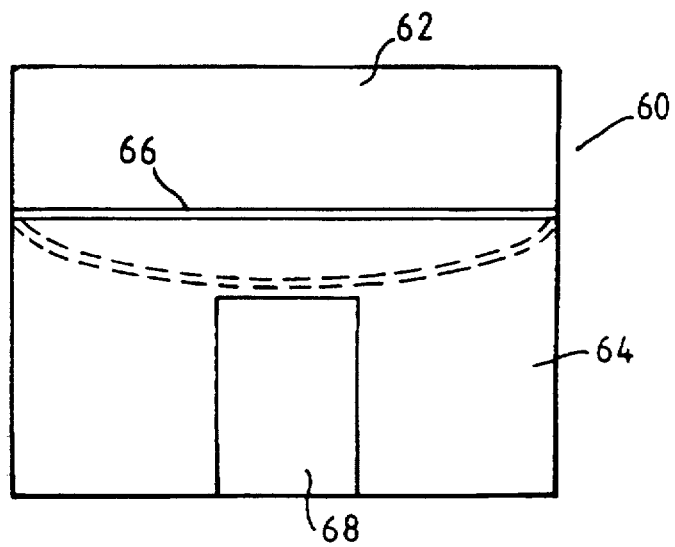
FIG. 14 is a cross-sectional view of an apparatus used for manufacturing a semiconductor device assembly according to the present invention.

The above described assemblies are fabricated using the equipment shown in FIG. 14. Numeral 60 designates a vacuum chamber. The inside of the chamber 60 is divided into an upper room 62 and a lower room 64 by an elastic film 66. A heater 68 is placed in the lower room 64. The lower room 64 is connected to a vacuum pump (not shown).

In case of fabrication of the assembly shown in FIGS. 1 and 2, first the leads 14 arranged on the tape 20 are connected with the chip 10 using TAB or MPB technology outside of the chamber 60. Then, the back film 20 is adhered to the chip 10, the leads 14 and tape 16. The half-finished assembly is put on the heater 68 with the back film 20 facing the heater 68. Then, the front film 18 is put on the half-finished assembly with the front film 18 facing the elastic film 66. The inside of the lower room 64 is evacuated by the pump to obtain a vacuum or reduced pressure. As the air is pumped out of the lower room 64, the elastic film 66 bulges toward the lower room 64 as shown by the dotted line in FIG. 13 and the front film 18 is pressed against the half-finished assembly. During this time, the heater 68 is operating. As a result of this process, the front film 18 and the back film 20 are thermally fused with the leads 14 and tape 16, and are adhered to each other.

According to this method, the front film 18 is in direct contact with the main surface of the chip 10 and with the leads 14, and the back film 20 is also in direct contact with the back surface of the chip 10, with the tape 16 and with the leads 14 through hermetically sealing the chip 10 in a vacuum or reduced pressure.

The present invention has been described with the respect to specific embodiments. However, other embodiments based on the principles of the present invention should be obvious to those of skill in the art. Such embodiments are intended to be covered by the claims.

What is claimed is:

1. A semiconductor device assembly comprising:

a semiconductor chip having first, second, and third surfaces;

a plurality of electrodes on the first surface;

a plurality of leads arranged around the chip, each of the leads having an end portion which contacts one of the electrodes at a side of the first surface of the semiconductor chip; and first and second films, the first film directly contacting the first surface of the semiconductor chip and a first side of the plurality of leads, the second film having a first contact portion directly contacting the second surface of the semiconductor chip and contacting with a part of the third surface, and a second contact portion directly contacting a second side of the plurality of leads, the first contact portion of the second film projecting from the second contact portion to a side of the second surface of the semiconductor chip, the first and second films being on opposite sides of the semiconductor chip and the leads.

2. A semiconductor device assembly comprising:

a semiconductor chip having first, second, and third surfaces;

a plurality of electrodes on the first surface;

a plurality of leads arranged around the chip, each of the leads having an end portion which contacts one of the electrodes; and first and second films, each of the films having a first contact portion and a second contact portion, the first film directly contacting the first surface of the semiconductor chip in an area of the first contact portion and including an adhesive layer adhered to a first side of the plurality of leads at the second contact portion, the second film directly contacting the second surface and a part of the third surface of the semiconductor chip in an area of the first contact portion and including an adhesive layer adhered to a second side of the plurality of leads at the second contact portion, the first and second films being on opposite sides of the semiconductor chip and the leads.

3. A semiconductor device assembly comprising:

a semiconductor chip having first, second, and third surfaces;

a plurality of electrodes on the first surface;

a plurality of leads arranged around the chip, each of the leads having an end portion which contacts one of the electrodes at a side of the first surface of the semiconductor chip; and first and second flexible plastic films consisting of insulating materials, the first film directly contacting the first surface of the semiconductor chip and a first side of the plurality of leads, the second film having a first contact portion directly contacting the second surface of the semiconductor chip and contacting a part of the third surface, and a second contact portion directly contacting a second side of the plurality of leads, the first contact portion of the second film projecting from the second contact portion to a side of the second surface of the semiconductor chip, the first and second films being on opposite sides of the semiconductor chip and the leads.

* * * * *

UNITED STATES PATENT AND TRADEMARK OFFICE
CERTIFICATE OF CORRECTION

PATENT NO.   : 5,767,572
DATED        : June 16, 1998
INVENTOR(S)  : FUJITSU

It is certified that error appears in the above-indentified patent and that said Letters Patent is hereby corrected as shown below:

On the Title Page, Item [54], and column 1, line 1 in the title before "SEMICONDUCTOR", insert --THIN--.

Signed and Sealed this

Twenty-seventh Day of July, 1999

Attest:

Q. TODD DICKINSON

*Attesting Officer*      *Acting Commissioner of Patents and Trademarks*